(12) United States Patent
Higuchi et al.

(10) Patent No.: US 10,317,796 B2
(45) Date of Patent: *Jun. 11, 2019

(54) SOLDER RESIST COMPOSITION AND COVERED PRINTED WIRING BOARD

(71) Applicant: GOO CHEMICAL CO., LTD., Kyoto (JP)

(72) Inventors: Michiya Higuchi, Kyoto (JP); Yoshio Sakai, Shiga (JP); Nobuhito Hamada, Kyoto (JP); Tokuzan Miyake, Kyoto (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/531,461

(22) PCT Filed: Dec. 10, 2014

(86) PCT No.: PCT/JP2014/006160
§ 371 (c)(1),
(2) Date: May 29, 2017

(87) PCT Pub. No.: WO2016/092598
PCT Pub. Date: Jun. 16, 2016

(65) Prior Publication Data
US 2017/0269477 A1    Sep. 21, 2017

(51) Int. Cl.
| G03F 7/004 | (2006.01) |
| G03F 7/029 | (2006.01) |
| G03F 7/027 | (2006.01) |
| G03F 7/031 | (2006.01) |
| G03F 7/16 | (2006.01) |
| G03F 7/085 | (2006.01) |
| H05K 3/28 | (2006.01) |
| G03F 7/028 | (2006.01) |
| G03F 7/20 | (2006.01) |
| G03F 7/32 | (2006.01) |
| G03F 7/40 | (2006.01) |
| G03F 7/038 | (2006.01) |
| H05K 1/03 | (2006.01) |

(52) U.S. Cl.
CPC .............. *G03F 7/029* (2013.01); *G03F 7/004* (2013.01); *G03F 7/027* (2013.01); *G03F 7/028* (2013.01); *G03F 7/031* (2013.01); *G03F 7/038* (2013.01); *G03F 7/16* (2013.01); *G03F 7/168* (2013.01); *G03F 7/2004* (2013.01); *G03F 7/322* (2013.01); *G03F 7/40* (2013.01); *H05K 1/0353* (2013.01); *H05K 3/285* (2013.01); *H05K 2201/2081* (2013.01)

(58) Field of Classification Search
None
See application file for complete search history.

(56) References Cited

U.S. PATENT DOCUMENTS

| 4,599,259 | A | * | 7/1986 | Kobayashi | ........... B41M 7/0054 428/201 |
| 5,723,262 | A | * | 3/1998 | Nakamura | ................ C08F 8/00 430/286.1 |
| 6,238,840 | B1 | * | 5/2001 | Hirayama | ............... G03F 7/038 430/280.1 |
| 2002/0102077 | A1 | * | 8/2002 | Szum | .................... C03C 25/106 385/100 |
| 2003/0170423 | A1 | * | 9/2003 | Katsumoto | ............ G02B 5/201 428/141 |
| 2004/0152798 | A1 | * | 8/2004 | Weissman | ................. C08F 2/50 522/8 |
| 2009/0066230 | A1 | * | 3/2009 | Hirosaki | ............. C01B 21/0602 313/504 |
| 2012/0070992 | A1 | * | 3/2012 | Dong | ...................... G03F 7/425 438/694 |
| 2013/0081864 | A1 | * | 4/2013 | Norikoshi | ............. G03F 7/0047 174/258 |
| 2014/0051248 | A1 | * | 2/2014 | Dong | .................. H01L 31/1804 438/689 |
| 2016/0342085 | A1 | * | 11/2016 | Sakai | ...................... G03F 7/031 |
| 2017/0204290 | A1 | * | 7/2017 | Simoff | .................... C08G 77/20 |

FOREIGN PATENT DOCUMENTS

| EP | 2 781 530 A1 | 9/2014 |
| JP | 2007-178459 | * 7/2007 |
| JP | 2008-107511 A | 5/2008 |
| JP | 2008-257045 A | 10/2008 |
| JP | 2009-14936 A | 1/2009 |
| JP | 2011-227343 A | 11/2011 |
| JP | 2012-078414 | * 4/2012 |
| JP | 2013-28729 A | 2/2013 |
| WO | WO-2010/060702 A1 | 6/2010 |

OTHER PUBLICATIONS

Liu et al., "Thermal and fluorescent properties of optical brighteners and the whitening effect for palletization of cycloolefin copolymers", Mat. Lett., vol. 60 pp. 2132-2137 (2006).*
Machine translation of JP 2007-178459 (2007).*
International Search Report for the Application No. PCT/JP2014/006160 dated Mar. 10, 2015.
Supplementary European Search Report for the Application No. EP 14 90 7967 dated Nov. 30, 2017.

* cited by examiner

*Primary Examiner* — Martin J Angebranndt
(74) *Attorney, Agent, or Firm* — Cheng Law Group, PLLC

(57) ABSTRACT

A solder resist composition includes: a carboxyl group-containing resin; a photopolymerizable compound; a photopolymerization initiator containing a bisacylphosphine oxide-based photopolymerization initiator and an α-hydroxy alkylphenone-based photopolymerization initiator; and a fluorescent dye. The bisacylphosphine oxide-based photopolymerization initiator contains bis-(2,4,6-trimethylbenzoyl)-phenylphosphine oxide. The α-hydroxy alkylphenone-based photopolymerization initiator contains 2-hydroxy-2-methyl-1-phenyl-propane-1-one. A mass ratio of the bis-(2,4,6-trimethylbenzoyl)-phenylphosphine oxide to the 2-hydroxy-2-methyl-1-phenyl-propane-1-one is 2:1 to 1:10.

6 Claims, No Drawings

SOLDER RESIST COMPOSITION AND COVERED PRINTED WIRING BOARD

TECHNICAL FIELD

The present invention relates to solder resist compositions and covered printed wiring boards, and specifically relates to: a solder resist composition which has photocurability and can be developed with an alkaline solution; and a covered printed wiring board including a solder resist layer formed with the solder resist composition.

BACKGROUND ART

In recent years, as a method for forming solder resist layers on printed wiring boards for consumer use and industrial use, a developable solder resist composition with excellent resolution and dimensional accuracy has been widely used, instead of a screen printing method, in order to increase the density of wiring on the printed wiring board.

Additionally, in recent years, there is an increasing use of optical elements, such as light-emitting diodes, mounted directly on a printed wiring board covered with a solder resist layer, wherein the light-emitting diodes are often used for: backlights in liquid crystal displays for mobile terminals, personal computers, and televisions; and light sources for lighting devices. Furthermore, when titanium dioxide is contained in the solder resist layer on the printed wiring board mounted with optical elements, the solder resist layer is whitened and therefore light emitted from the optical elements is efficiently reflected at the solder resist layer (see JP5513965B2).

However, in a process of curing the solder resist composition under exposure to light, titanium dioxide contained in the solder resist composition may cause difficulty in curing of the solder resist composition due to titanium dioxide reflecting or absorbing light. Especially when the solder resist composition contains a large amount of titanium dioxide, it is difficult for the solder resist layer formed with the solder resist composition to completely cure down to a deep part of the solder resist layer. If the deep part of the solder resist layer is not thoroughly cured, it is likely for defects to occur, such as lowered resolution in development, wrinkles on the solder resist layer caused by a difference in curing shrinkages of the deep part and a surface of the solder resist layer, and cracks on the solder resist layer when heated due to a partial stress caused by a difference in thermal expansion coefficients of the deep part and the surface of the solder resist layer. In addition, the solder resist composition is also required to have good storage stability.

SUMMARY OF INVENTION

The present invention has been made in light of the above-described circumstances, and it is an object thereof to provide: a solder resist composition which has good storage stability and can form a coating film thoroughly curable from a surface to a deep part under exposure to light; and a covered printed wiring board including a solder resist layer formed with the solder resist composition.

A solder resist composition according to one aspect of the present invention includes: (A) a carboxyl group-containing resin; (B) a photopolymerizable compound selected from a group consisting of a photopolymerizable monomer and a photopolymerizable prepolymer; (C) a photopolymerization initiator containing a bisacylphosphine oxide-based photopolymerization initiator and an α-hydroxy alkylphenone-based photopolymerization initiator; and (D) a fluorescent dye. The bisacylphosphine oxide-based photopolymerization initiator is bis-(2,4,6-trimethylbenzoyl)-phenylphosphine oxide The α-hydroxy alkylphenone-based photopolymerization initiator is 2-hydroxy-2-methyl-1-phenyl-propane-1-one. A mass ratio of the bis-(2,4,6-trimethylbenzoyl)-phenylphosphine oxide to the 2-hydroxy-2-methyl-1-phenyl-propane-1-one is 2:1 to 1:10.

A covered printed wiring board according to one aspect of the present invention includes: a printed wiring board; and a solder resist layer covering the printed wiring board. The solder resist layer is formed with the solder resist composition.

DESCRIPTION OF EMBODIMENTS

An embodiment for implementing the present invention is now described. It should be noted that in the description from now on, acryloyl and/or methacryloyl are represented as (meth)acryloyl. Also, acrylate and/or methacrylate are represented as (meth)acrylate. Also, acrylic acid and/or methacrylic acid are represented as (meth)acrylic acid.

[(A) Carboxyl Group-Containing Resin]

In the present embodiment, the solder resist composition contains a carboxyl group-containing resin as an (A) component. The carboxyl group-containing resin can provide a coating film formed with the solder resist composition with developability in an alkaline solution, i.e., alkaline developability.

[(A1) Carboxyl Group-Containing Resin which Contains a Carboxyl Group but does not Contain any Photopolymerizable Functional Groups]

The carboxyl group-containing resin may contain a compound (hereinafter referred to as a component (A1)) which contains a carboxyl group but is not photopolymerizable.

The component (A1) contains, for example, a polymer of an ethylene-based unsaturated monomer including an ethylene-based unsaturated compound which contains a carboxyl group. The ethylene-based unsaturated monomer may further contain an ethylene-based unsaturated compound which does not contain any carboxyl groups.

The ethylene-based unsaturated compound which contains a carboxyl group may contain appropriate polymers and prepolymers, and may contain, for example, a compound which contains only one ethylene-based unsaturated group. More specifically, the ethylene-based unsaturated compound which contains a carboxyl group may contain one or more kinds of compounds selected from a group consisting of, for example, acrylic acid, methacrylic acid, ω-carboxyl-polycaprolactone (n≈2) monoacrylate, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethylacrylate, 2-acryloyloxypropyl phthalic acid, 2-methacryloyloxypropyl phthalic acid, 2-acryloyloxyethyl maleic acid, 2-methacryloyloxyethyl maleic acid, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound which contains a carboxyl group may also contain a compound which contains multiple ethylene-based unsaturated groups. More specifically, for example, the ethylene-based unsaturated compound which contains a carboxyl group may contain a compound obtained by reacting a dibasic acid anhydride with a polyfunctional (meth)acrylate which contains a hydroxyl group selected from a group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate. These compounds may be used alone or in combination.

The ethylene-based unsaturated compound which does not contain any carboxyl groups may be any compound as long as it is copolymerizable with the ethylene-based unsaturated compound which contains a carboxyl group. The ethylene-based unsaturated compound which does not contain any carboxyl groups may contain either one of an aromatic ring-containing compound and an aromatic ring-free compound.

The aromatic ring-containing compound may contain one or more kinds of compounds selected from a group consisting of, for example, 2-(meth)acryloyloxyethyl-2-hydroxyethyl phthalate, benzyl (meth)acrylate, neopentyl glycol benzoate (meth)acrylate, paracumyl phenoxyethylene glycol (meth)acrylate, EO-modified cresol (meth)acrylate, ethoxylated phenyl (meth)acrylate, nonylphenoxy polyethylene glycol (meth)acrylate (n=2-17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl.

The aromatic ring-free compound may contain one or more kinds of compounds selected from a group consisting of, for example, straight or branched aliphatic (meth)acrylic acid esters or alicyclic (meth)acrylic acid esters (which may contain unsaturated bonding partially in a carbon ring), hydroxyalkyl (meth)acrylates, alkoxyalkyl (meth)acrylates, and N-substituted maleimides such as N-cyclohexylmaleimide. The aromatic ring-free compound may further contain a compound which contains two or more ethylene-based unsaturated groups per molecule, such as polyethylene glycol di(meth)acrylate, polypropylene glycol di(meth)acrylate, trimethylolpropane tri(meth)acrylate, and pentaerythritol tri(meth)acrylate. These compounds may be used alone or in combination. These compounds are preferred since hardness and oiliness of the solder resist layer can be easily adjusted.

Kinds and ratios of compounds used to obtain the component (A1) are appropriately selected so that an acid value of the component (A1) is an appropriate value. The acid value of the component (A1) is preferably within a range of 20 to 180 mgKOH/g and further preferably within a range of 35 to 165 mgKOH/g.

[(A2) Carboxyl Group-Containing Resin which Contains a Carboxyl Group and a Photopolymerizable Functional Group]

The carboxyl group-containing resin may also contain photopolymerizable carboxyl group-containing resin (hereinafter referred to as a component (A2)) which contains a carboxyl group and a photopolymerizable functional group. The photopolymerizable functional group is, for example, an ethylene-based unsaturated group.

The component (A2) may contain resin (hereinafter referred to as first resin (a)), for example, having a structure resulting from an addition reaction of: at least one kind of a compound (a3) selected from polycarboxylic acids and anhydrides thereof; and a reaction product between an ethylene-based unsaturated compound (a2) which contains a carboxyl group and at least one epoxy group in an epoxy compound (a1) which contains two or more epoxy groups per molecule.

The epoxy compound (a1) may contain at least one kind of compound selected from a group consisting of, for example, cresol novolak epoxy resin, phenol novolak epoxy resin, bisphenol A epoxy resin, bisphenol F epoxy resin, bisphenol A-novolak epoxy resin, naphthalene epoxy resin, biphenyl epoxy resin, biphenyl aralkyl epoxy resin, triglycidyl isocyanurate, and alicyclic epoxy resin.

The epoxy compound (a1) may contain a polymer of an ethylene-based unsaturated compound (p) which includes an epoxy group-containing compound (p1). The ethylene-based unsaturated compound (p) provided for a synthesis of the polymer may contain the epoxy group-containing compound (p1) alone or in combination with an epoxy group-free compound (p2).

The epoxy group-containing compound (p1) may contain a compound selected from appropriate polymers and prepolymers. Specifically, the epoxy group-containing compound (p1) may contain one or more kinds of compounds selected from a group consisting of epoxy cyclohexyl derivatives of acrylic acids, epoxy cyclohexyl derivatives of methacrylic acids, alicyclic epoxy derivatives of acrylates, alicyclic epoxy derivatives of methacrylates, β-methyl glycidyl acrylates, and β-methyl glycidyl methacrylates. Especially, the epoxy group-containing compound (p1) is preferred to contain glycidyl (meth)acrylate, which is widely used and easily obtained.

The epoxy group-free compound (p2) may be any compound as long as it is copolymerizable with the epoxy group-containing compound (p1). The epoxy group-free compound (p2) may contain one or more kinds of compounds selected from a group consisting of, for example, 2-(meth)acryloyloxyethyl phthalate, 2-(meth)acryloyloxyethyl-2-hydroxyethyl phthalate, 2-(meth)acryloyloxypropyl phthalate, benzyl (meth)acrylate, neopentyl glycol benzoate (meth)acrylate, paracumyl phenoxyethylene glycol (meth) acrylate, EO-modified cresol (meth)acrylate, ethoxylated phenyl (meth)acrylate, nonylphenoxy polyethylene glycol (meth)acrylate (polymerization degree n=2-17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, vinylcarbazole, styrene, N-phenylmaleimide, N-benzylmaleimide, N-succinimidyl 3-maleimidobenzoate, straight or branched aliphatic (meth)acrylic acid esters or alicyclic (meth)acrylic acid esters (which may contain unsaturated bonding partially in a carbon ring), hydroxyalkyl (meth)acrylates, alkoxyalkyl (meth)acrylates, and N-substituted maleimides (for example, N-cyclohexylmaleimide).

The epoxy group-free compound (p2) may further contain a compound which contains two or more ethylene-based unsaturated groups per molecule. When this compound is used and an amount thereof is adjusted, the hardness and the oiliness of the solder resist layer can be easily adjusted. The compound which contains two or more ethylene-based unsaturated groups per molecule may contain one or more kinds of compounds selected from a group consisting of, for example, polyethylene glycol di(meth)acrylate, polypropylene glycol di(meth)acrylate, trimethylolpropane tri(meth)acrylate, and pentaerythritol tri(meth)acrylate.

The ethylene-based unsaturated compound (p) is polymerized to obtain polymers by a known polymerization method such as, for example, solution polymerization and emulsion polymerization. Examples of the solution polymerization include: a method in which the ethylene-based unsaturated compound (p) is heated and stirred in presence of a polymerization initiator in an appropriate organic solvent under a nitrogen atmosphere; and azeotropic polymerization.

The organic solvent used for polymerization of the ethylene-based unsaturated compound (p) may contain one or more kinds of compounds selected from a group consisting of: for example, ketones such as methyl ethyl ketone and cyclohexanone; aromatic hydrocarbons such as toluene and xylene; acetic esters such as ethyl acetate, butyl acetate, cellosolve acetate, butyl cellosolve acetate, carbitol acetate, butyl carbitol acetate, and propylene glycol monomethylether acetate; and dialkyl glycol ethers.

The polymerization initiator used for polymerization of the ethylene-based unsaturated compound (p) may contain one or more kinds of compounds selected from a group consisting of, for example, hydroperoxides such as diisopropylbenzene hydroperoxide, dialkyl peroxides such as dicumyl peroxide and 2,5-dimethyl-2,5-di-(t-butylperoxy)-hexane, diacyl peroxides such as isobutyryl peroxide, ketone peroxides such as methyl ethyl ketone peroxide, alkyl peresters such as t-butyl peroxypivalate, peroxydicarbonates such as diisopropyl peroxydicarbonate, azo compounds such as azobisisobutyronitrile, and redox type initiators.

The ethylene-based unsaturated compound (a2) may contain a compound selected from a group consisting of appropriate polymers and prepolymers. The ethylene-based unsaturated compound (a2) may contain a compound which contains only one ethylene-based unsaturated group. The compound which contains only one ethylene-based unsaturated group may contain one or more kinds of compounds selected from a group consisting of, for example, acrylic acid, methacrylic acid, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethyl acrylate, 2-acryloyloxypropyl phthalic acid, 2-methacryloyloxypropyl phthalic acid, 2-acryloyloxyethyl maleic acid, 2-methacryloyloxyethyl maleic acid, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound (a2) may further contain a compound which contains multiple ethylene-based unsaturated groups. The compound which contains multiple ethylene-based unsaturated groups may contain one or more kinds of compounds selected from a group consisting of compounds which are obtained by reacting a dibasic acid anhydride with a polyfunctional acrylate or a polyfunctional methacrylate which contains a hydroxyl group such as, for example, pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate.

The ethylene-based unsaturated compound (a2) is especially preferred to contain at least one of acrylic acid and methacrylic acid. In this case, since an ethylene-based unsaturated group derived from acrylic acid and methacrylic acid has especially excellent photoreactivity, the first resin (a) can gain high photoreactivity.

An amount of the ethylene-based unsaturated compound (a2) used is preferably adjusted so that an amount of carboxyl groups in the ethylene-based unsaturated compound (a2) is within a range of 0.4 to 1.2 mol per 1 mol of epoxy groups in the epoxy compound (a1), and especially preferably adjusted so that the amount of carboxyl groups in the ethylene-based unsaturated compound (a2) is within a range of 0.5 to 1.1 mol per 1 mol of epoxy groups in the epoxy compound (a1).

The compound (a3) selected from polycarboxylic acids and anhydrides thereof may contain one or more kinds of compounds selected from a group consisting of: for example, dicarboxylic acids such as phthalic acid, tetrahydrophthalic acid, methyltetrahydrophthalic acid, methylnadic acid, hexahydrophthalic acid, methylhexahydrophthalic acid, succinic acid, methylsuccinic acid, maleic acid, citraconic acid, glutaric acid, and itaconic acid; polycarboxylic acids of tri or higher basic acids such as cyclohexane-1,2,4-tricarboxylic acid, trimellitic acid, pyromellitic acid, benzophenonetetracarboxylic acid, and methylcyclohexenetetracarboxylic acid; and anhydrides thereof.

The compound (a3) is used mainly for providing the first resin (a) with an acid value and thereby supplying the solder resist composition with redispersibility and resolubility in a dilute aqueous alkaline solution. An amount of the compound (a3) used is adjusted so that an acid value of the first resin (a) is preferably greater than or equal to 30 mgKOH/g and especially preferably greater than or equal to 60 mgKOH/g. Furthermore, the amount of the compound (a3) used is adjusted so that the acid value of the first resin (a) is preferably less than or equal to 160 mgKOH/g and especially preferably less than or equal to 130 mgKOH/g.

In synthesis of the first resin (a), a known method can be employed to promote an addition reaction between the epoxy compound (a1) and the ethylene-based unsaturated compound (a2) and a subsequent addition reaction between a product thereof (a product of the preceding addition reaction) and the compound (a3). For example, in the addition reaction between the epoxy compound (a1) and the ethylene-based unsaturated compound (a2), the ethylene-based unsaturated compound (a2) is added to a solvent solution of the epoxy compound (a1), then if necessary a heat polymerization inhibitor and a catalyst are added, and the mixture is stirred and mixed to obtain a reactive solution. The reactive solution undergoes the addition reaction using an ordinary method at a reaction temperature of preferably 60 to 150° C. and especially preferably 80 to 120° C., and the product of the preceding addition reaction is obtained. Examples of the heat polymerization inhibitor may include hydroquinone and hydroquinone monomethyl ether. Examples of the catalyst may include tertiary amines such as benzyldimethylamine and triethylamine, quaternary ammonium salts such as trimethylbenzylammonium chloride and methyltriethylammonium chloride, triphenylphosphine, and triphenylstibine.

In order to promote the subsequent addition reaction between the product of the preceding addition reaction and the compound (a3), the compound (a3) is added to a solvent solution of the product of the preceding addition reaction, then if necessary a heat polymerization inhibitor and a catalyst are added, and the mixture is stirred and mixed to obtain a reactive solution. The reactive solution undergoes the addition reaction using an ordinary method, and the first resin (a) is obtained. Reaction conditions of the subsequent addition reaction may be same as the reaction conditions of the preceding addition reaction between the epoxy compound (a1) and the ethylene-based unsaturated compound (a2). The heat polymerization inhibitor and the catalyst used for the preceding addition reaction between the epoxy compound (a1) and the ethylene-based unsaturated compound (a2) which contains a carboxyl group may be used in the subsequent addition reaction.

The component (A2) may contain carboxyl group-containing (meth)acrylic copolymer resin (referred to as second resin (b)) obtained from a reaction between a part of carboxyl groups in a polymer of an ethylene-based unsaturated monomer including an ethylene-based unsaturated compound which contains a carboxyl group, and an ethylene-based unsaturated compound which contains an epoxy group. The ethylene-based unsaturated monomer may include an ethylene-based unsaturated compound which does not contain any carboxyl groups, if necessary.

The ethylene-based unsaturated compound which contains a carboxyl group used to obtain the second resin (b) may contain appropriate polymers and prepolymers. For example, the ethylene-based unsaturated compound which contains a carboxyl group may contain a compound which contains only one ethylene-based unsaturated group. More specifically, the ethylene-based unsaturated compound which contains a carboxyl group may contain one or more kinds of compounds selected from a group consisting of, for example, acrylic acid, methacrylic acid, ω-carboxyl-polycaprolactone (n≈2) monoacrylate, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethylacrylate, 2-acryloyloxypropyl phthalic acid, 2-methacryloyloxypropyl phthalic acid, 2-acryloyloxyethyl maleic acid, 2-methacryloyloxyethyl maleic acid, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid. The ethylene-based unsaturated compound which contains a carboxyl group may also contain a compound which contains multiple ethylene-based unsaturated groups. More specifically, for example, the ethylene-based unsaturated compound which contains a carboxyl group may contain a compound obtained by reacting a dibasic acid anhydride with a polyfunctional (meth)acrylate which contains a hydroxyl group selected from a group consisting of pentaerythritol triacrylate, pentaerythritol trimethacrylate, trimethylolpropane diacrylate, trimethylolpropane dimethacrylate, dipentaerythritol pentaacrylate, and dipentaerythritol pentamethacrylate. These compounds may be used alone or in combination.

The ethylene-based unsaturated compound which does not contain any carboxyl groups used to obtain the second resin (b) may be any compound as long as it is copolymerizable with the ethylene-based unsaturated compound which contains a carboxyl group. The ethylene-based unsaturated compound which does not contain any carboxyl groups may contain either one of an aromatic ring-containing compound and an aromatic ring-free compound.

The aromatic ring-containing compound may contain one or more kinds of compounds selected from a group consisting of, for example, 2-(meth)acryloyloxyethyl-2-hydroxyethyl phthalate, benzyl (meth)acrylate, neopentyl glycol benzoate (meth)acrylate, paracumyl phenoxyethylene glycol (meth)acrylate, EO-modified cresol (meth)acrylate, ethoxylated phenyl (meth)acrylate, nonylphenoxy polyethylene glycol (meth)acrylate (n=2 to 17), ECH-modified phenoxy (meth)acrylate, phenoxy diethylene glycol (meth)acrylate, phenoxyethyl (meth)acrylate, phenoxy hexaethylene glycol (meth)acrylate, phenoxy tetraethylene glycol (meth)acrylate, tribromophenyl (meth)acrylate, EO-modified tribromophenyl (meth) acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified phthalic acid di(meth)acrylate, trimethylolpropane benzoate (meth)acrylate, EO-modified phthalic acid (meth)acrylate, EO/PO-modified phthalic acid (meth)acrylate, N-phenylmaleimide, N-benzylmaleimide, N-vinylcarbazole, styrene, vinylnaphthalene, and 4-vinylbiphenyl.

The aromatic ring-free compound may contain one or more kinds of compounds selected from a group consisting of: for example, straight or branched aliphatic (meth)acrylic acid esters or alicyclic (meth)acrylic acid esters (which may contain unsaturated bonding partially in a carbon ring); hydroxyalkyl (meth)acrylates; alkoxyalkyl (meth)acrylates; and N-substituted maleimides such as N-cyclohexylmaleimide. The aromatic ring-free compound may further contain a compound which contains two or more ethylene-based unsaturated groups per molecule, such as polyethylene glycol di(meth)acrylate, polypropylene glycol di(meth)acrylate, trimethylolpropane tri(meth)acrylate, and pentaerythritol tri(meth)acrylate. These compounds may be used alone or in combination. These compounds are preferred since the hardness and the oiliness of the solder resist layer can be easily adjusted.

Examples of the ethylene-based unsaturated compound which contains an epoxy group used to obtain the second resin (b) may include appropriate polymers and prepolymers. Specific examples of the ethylene-based unsaturated compound which contains an epoxy group may include epoxycyclohexyl derivatives of acrylic acids or methacrylic acids, alicyclic epoxy derivatives of acrylates or methacrylates, β-methylglycidyl acrylates, and β-methylglycidyl methacrylates. These compounds may be used alone or in combination. Especially, it is preferred to use glycidyl (meth)acrylate, which is widely used and easily obtained.

The component (A2) may contain resin (hereinafter referred to as third resin (c)) obtained by adding a compound which contains an ethylene-based unsaturated group and an isocyanate group to a part or all of hydroxyl groups in a polymer of an ethylene-based unsaturated monomer including: an ethylene-based unsaturated compound which contains a carboxyl group; and an ethylene-based unsaturated compound which contains a hydroxyl group. The ethylene-based unsaturated monomer may include an ethylene-based unsaturated compound which does not contain any carboxyl groups or hydroxyl groups, if necessary.

The ethylene-based unsaturated compound which contains a carboxyl group used to obtain the third resin (c) may be selected from, for example, compounds which can be used as the ethylene-based unsaturated compound which contains a carboxyl group used to obtain the second resin (b).

Examples of the ethylene-based unsaturated compound which contains a hydroxyl group used to obtain the third resin (c) may include: hydroxyalkyl (meth)acrylates such as 2-hydroxyethyl (meth)acrylate, 2-hydroxypropyl (meth) acrylate, 4-hydroxybutyl (meth) acrylate, cyclohexane dimethanol mono(meth)acrylate, 2-(meth)acryloyloxyethyl- 2-hydroxyethylphthalate, caprolactone (meth)acrylate, polyethylene glycol (meth)acrylate, polypropylene glycol (meth)acrylate, trimethylolpropane di(meth)acrylate, pentaerythritol tri(meth)acrylate, and dipentaerythritol penta (meth)acrylate; hydroxybutyl vinyl ether; hydroxyethyl vinyl ether; and N-hydroxyethyl (meth)acrylamide.

Specific examples of the compound which contains an ethylene-based unsaturated group and an isocyanate group used to obtain the third resin (c) may include 2-acryloyloxyethyl isocyanate (for example, KarenzAOI manufactured by Showa Denko K.K.), 2-methacryloyloxyethyl isocyanate (for example, KarenzMOI manufactured by Showa Denko K.K.), methacryloyloxy ethoxyethyl isocyanate (for example, KarenzMOI-EG manufactured by Showa Denko K.K.), isocyanate blocked compound of KarenzMOI (for example, KarenzMOI-BM manufactured by Showa Denko K.K.), isocyanate blocked compound of KarenzMOI (for example, KarenzMOI-BP manufactured by Showa Denko K.K.), and 1,1-(bisacryloyloxymethyl)ethyl isocyanate (for example, KarenzBEI manufactured by Showa Denko K.K.).

A weight-average molecular weight of the entire component (A2) is preferably within a range of 800 to 100000. Within this range, the solder resist composition gains especially excellent photosensitivity and resolution.

An acid value of the entire component (A2) is preferably greater than or equal to 30 mgKOH/g. In this case, the solder resist composition gains good developability. The acid value is further preferably greater than or equal to 60 mgKOH/g. In addition, the acid value of the entire component (A2) is preferably less than or equal to 160 mgKOH/g. In this case, an amount of remaining carboxyl groups in the film formed with the solder resist composition decreases, thus good electric properties, electric corrosion resistance and water resistance of the film are ensured. The acid value is further preferably less than or equal to 130 mgKOH/g.

[(B) Photopolymerizable Compound]

In the present embodiment, the solder resist composition contains a photopolymerizable compound as a (B) component which is a photopolymerizable compound selected from a group consisting of a photopolymerizable monomer and a photopolymerizable prepolymer. The photopolymerizable compound provides photocurability to the solder resist composition. The photopolymerizable compound contains one or more kinds of compounds selected from a group consisting of photopolymerizable monomers and photopolymerizable prepolymers.

The photopolymerizable monomer contains, for example, an ethylene-based unsaturated group. The photopolymerizable monomer may contain one or more kinds of compounds selected from a group consisting of: for example, monofunctional (meth)acrylates such as 2-hydroxyethyl (meth)acrylate; and polyfunctional (meth)acrylates such as diethylene glycol di(meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, and n-caprolactone-modified dipentaerythritol hexaacrylate.

The photopolymerizable monomer preferably contains a phosphorus-containing compound (a phosphorus-containing photopolymerizable compound). In this case, flame retardancy of the cured product of the solder resist composition is improved. The phosphorus-containing photopolymerizable compound may contain one or more kinds of compounds selected from a group consisting of, for example, 2-methacryloyloxy ethyl acid phosphate (for example, Light Ester P-1M and Light Ester P-2M manufactured by Kyoeisha Chemical Co., Ltd.), 2-acryloyloxy ethyl acid phosphate (for example, Light Acrylate P-1A manufactured by Kyoeisha Chemical Co., Ltd.), diphenyl-2-methacryloyloxy ethyl phosphate (for example, MR-260 manufactured by Daihachi Chemical Industry Co., Ltd.), and HFA series manufactured by Showa Highpolymer K. K. (for example, HFA-6003 and HFA-6007 which are products of an addition reaction of dipentaerythritol hexaacrylate and HCA, and HFA-3003 and HFA-6127 which are products of an addition reaction of caprolactone-modified dipentaerythritol hexaacrylate and HCA).

Examples of the photopolymerizable prepolymer may include: a prepolymer which is prepared by adding an ethylene-based unsaturated group to a prepolymer obtained by polymerization of photopolymerizable monomers: and oligo (meth)acrylate prepolymers such as epoxy (meth)acrylates, polyester (meth)acrylates, urethane (meth)acrylates, alkyd resin (meth)acrylates, silicone resin (meth)acrylates, and spiran resin (meth)acrylates.

[(C) Photopolymerization Initiator]

In the present embodiment, the solder resist composition contains a bisacylphosphine oxide-based photopolymerization initiator and an α-hydroxy alkylphenone-based photopolymerization initiator as a photopolymerization initiator which is a (C) component. Therefore, in the present embodiment, high sensitivity of the solder resist composition can be achieved. In other words, the coating film formed with the solder resist composition can be thoroughly cured from a surface to a deep part under exposure to ultraviolet rays to form the solder resist layer. The reason for this is considered as following.

The bisacylphosphine oxide-based photopolymerization initiator reacts to a comparatively long-wavelength component of ultraviolet rays. Such comparatively long-wavelength component is likely to reach the deep part of the coating film made of the solder resist composition. Therefore, the bisacylphosphine oxide-based photopolymerization initiator can improve the efficiency of a photo-curing reaction in the deep part of the coating film.

On the other hand, the α-hydroxyalkyl phenone-based photopolymerization initiator reacts to a comparatively short-wavelength component of ultraviolet rays. Such comparatively short-wavelength component is unlikely to reach the deep part of the coating film. However, the α-hydroxyalkyl phenone-based photopolymerization initiator is unlikely to be interfered by oxygen, and therefore has high photoreactivity. Due to this, the α-hydroxyalkyl phenone-based photopolymerization initiator can improve the efficiency of a photo-curing reaction at the surface of the coating film.

If the solder resist layer is thoroughly cured from its surface to its deep part, the degree of curing of the solder resist layer tends not to be uneven, leading to less occurrence of wrinkles caused by shrinkage during curing. Accordingly, the solder resist layer has improved smoothness.

In addition, if the solder resist layer is thoroughly cured from the surface to the deep part, the solder resist layer can have high homogeneity. Due to this, even when the solder resist layer is deformed due to heat during steps such as soldering and reflow and thus experiences stress, such stress tends to be distributed throughout the solder resist layer, leading to less occurrence of cracks.

Also, the α-hydroxyalkyl phenone-based photopolymerization initiator does not generate a benzyl radical during the photo-curing reaction, and therefore the solder resist layer is unlikely to be colored. Furthermore, although the bisacylphosphine oxide-based photopolymerization initiator naturally has a color, bleaching occurs due to decomposition during the photo-curing reaction, as a result of which the solder resist layer is unlikely to be colored. Thus, the solder resist layer is prevented from turning yellow, whiteness of the solder resist layer is increased, and good light reflectivity of the solder resist layer can be ensured.

Moreover, the bisacylphosphine oxide-based photopolymerization initiator is generally likely to be crystallized. If crystals of the bisacylphosphine oxide-based photopolymerization initiator are precipitated in the solder resist composition, it becomes difficult for the solder resist composition to be uniformly cured using ultraviolet rays. However, in the present embodiment, since the solder resist composition contains the α-hydroxyalkyl phenone-based photopolymerization initiator, the crystals of the bisacylphosphine oxide-based photopolymerization initiator are prevented from being precipitated even when the solder resist composition is stored for a long period of time. Accordingly, the solder resist composition has improved storage stability.

In the present embodiment, in order to increase the sensitivity and the storage stability, bis-(2,4,6-trimethylbenzoyl)-phenylphosphine oxide (hereinafter referred to as a component (C1)) is used as the bisacylphosphine oxide-based photopolymerization initiator and 2-hydroxy-2-methyl-1-phenyl-propane-1-one (also known as 2-hydroxy-2-methyl propiophenone) (hereinafter referred to as a component (C2)) is used as the α-hydroxyalkyl phenone-based photopolymerization initiator.

In the present embodiment, in order to prevent coloring of the solder resist layer and to increase the sensitivity and the storage stability, a mass ratio of the bis-(2,4,6-trimethylbenzoyl)-phenylphosphine oxide to the 2-hydroxy-2-methyl-1-phenyl-propane-1-one (a mass ratio of the (C1) component to the (C2) component) is within a range of 2:1 to 1:10. When a ratio of the mass of the (C2) component to the mass of the (C1) component that is 2 is equal to or greater than 1, the (C1) component is particularly prevented from being crystallized in the solder resist composition, leading to the especially high storage stability of the solder resist composition. Also, when a ratio of the mass of the (C2) component to the mass of the (C1) component which is 1 is equal to or less than 10, the curability of the deep part of the solder resist layer is improved. The mass ratio of the (C1) component to the (C2) component is further preferably within a range of 1:1 to 1:5.

In the present embodiment, the bisacylphosphine oxide-based photopolymerization initiator preferably contains the (C1) component only. However, the bisacylphosphine oxide-based photopolymerization initiator may contain a bisacylphosphine oxide-based photopolymerization initiator other than the (C1) component without departing from the scope of the present invention. The bisacylphosphine oxide-based photopolymerization initiator other than the (C1) component may contain one or more kinds of compounds selected from a group consisting of, for example, bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, and (2,5,6-trimethylbenzoyl)-2,4,4-trimethylpentylphosphine oxide.

In the present embodiment, the α-hydroxyalkyl phenone-based photopolymerization initiator preferably contains the (C2) component only. However, the α-hydroxyalkyl phenone-based photopolymerization initiator may contain an α-hydroxyalkyl phenone-based photopolymerization initiator other than the (C2) component without departing from the scope of the present invention. The α-hydroxyalkyl phenone-based photopolymerization initiator other than the (C2) component may contain one or more kinds of compounds selected from a group consisting of, for example, phenylglyoxylic acid methyl ester, 1-hydroxy cyclohexyl phenyl ketone, 1-[4-(2-hydroxy ethoxy)-phenyl]-2-hydroxy-2-methyl-1-propane-1-one, and 2-hydroxy-1-{4-[4-(2-hydrox-2-methyl-propyonyl)-benzyl]phenyl}-2-methyl-propane-1-one.

In the present embodiment, the photopolymerization initiator preferably contains the bisacylphosphine oxide-based photopolymerization initiator and the α-hydroxyalkyl phenone-based photopolymerization initiator only. However, the photopolymerization initiator may contain a photopolymerization initiator other than the above two kinds of photopolymerization initiators without departing from the scope of the present invention. For example, the photopolymerization initiator may contain, in addition to the above two kinds of photopolymerization initiators, one or more kinds of compounds selected from a group consisting of: benzoins and alkylethers thereof; acetophenones such as acetophenone and benzyldimethyl ketal; anthraquinones such as 2-methylanthraquinone; thioxanthones such as 2,4-dimethylthioxanthone, 2,4-diethylthioxanthone, 2-isopropylthioxanthone, 4-isopropylthioxanthone, and 2,4-diisopropylthioxanthone; benzophenones such as benzophenone and 4-benzoyl-4'-methyldiphenylsulfide; xanthones such as 2,4-diisopropylxanthone; nitrogen atom-containing compounds such as 2-methyl-1-[4-(methylthio)phenyl]-2-morpholino-1-propanone; monoacylphosphine oxide-based photopolymerization initiators such as 2,4,6-trimethylbenzoyl-diphenyl-phosphne oxide (DAROCUR TPO) and 2,4,6-trimethylbenzoyl-ethyl-phenyl-phosphinate (SPEEDCURE TPO-L); 1,2-octanedione; 1-[4-(phenylthio)-2-(O-benzoyloxyme)] (IRGACURE OXE 01); ethanone; and 1-[9-ethyl-6-(2-methylbenzoyl)-9H-carbazole-3-yl]-1-(O-acetyloxime) (IRGACURE OXE 02).

[(D) Fluorescent Dye]

In the present embodiment, the solder resist composition contains a (D) component. Due to this, in the present embodiment, high sensitivity of the solder resist composition can be achieved. In other words, the coating film formed with the solder resist composition can be thoroughly cured from its surface to its deep part under exposure to ultraviolet rays to form the solder resist layer. Since the solder resist composition contains the fluorescent dye and the bisacylphosphine oxide-based photopolymerization initiator which absorbs light having a wavelength of 400 nm or larger, the fluorescent dye functions as a sensitizer for the photopolymerization initiator. In a case where the solder resist composition of the present embodiment contains a white pigment, an effect of the fluorescent dye as the sensitizer is enlarged since the white pigment reflects light when exposed to light. In addition, a case where the solder resist composition contains the fluorescent dye, reflectivity of the solder resist layer in a blue wavelength region improves since the fluorescent dye absorbs light in an ultraviolet wavelength region and emits light in the blue wavelength region.

It is preferably to use a fluorescent dye which absorbs light with a wavelength of 200 to 400 nm and emits light with a wavelength of 400 to 500 nm. Examples of such fluorescent dye includes a benzoxazole derivative having naphthalene as a substituent, a benzoxazole derivative having thiophene as a substituent, a benzoxazole derivative having stilbene as a substituent, a coumarin derivative, a styrene biphenyl derivative, a pyrazolone derivative, and a bis(triazinylamino)stilbenedisulfonic acid derivative.

[(E) Antioxidant]

In the present embodiment, the solder resist composition preferably contains an antioxidant as an (E) component. In this case, generation of oxygen radicals which may inhibit UV curing under exposure to light is prevented, making it possible to increase the resolution of the solder resist composition according to the present embodiment. In addition, the antioxidant can remove oxygen which may promote coloring of the solder resist layer during heat treatment of the printed wiring board (the covered printed wiring board below) including the solder resist layer, leading to less yellowing of the solder resist layer due to heat.

The antioxidant may contain one or more kinds of compounds selected from a group consisting of, for example, phenol antioxidants.

[(F) Coloring Pigment]

In the present embodiment, the solder resist composition preferably contains a coloring pigment as a (F) component. In this case, light reflectivity and a concealing property of the solder resist layer formed with the solder resist composition of the present embodiment can be improved. A white pigment can be used as the coloring pigment to form a white solder resist layer having the light reflectivity. A black pigment can be used as the coloring pigment to form a black solder resist layer having the concealing property.

Examples of the white pigment include titanium dioxide and zinc oxide, and one or more kinds of such compounds are used as the white pigment. Among these compounds, the titanium dioxide is preferred since it makes it possible to form the white solder resist layer having the high light reflectivity. The titanium dioxide may contain either one or both of rutile titanium dioxide and anatase titanium dioxide. The titanium dioxide especially preferably contains the rutile titanium dioxide. The rutile titanium dioxide is manufactured either by a chlorine method or a sulfuric acid method. In the present embodiment, the rutile titanium dioxide may contain either one or both of the rutile titanium dioxide manufactured by the chlorine method and the rutile titanium dioxide manufactured by the sulfuric acid method. Note that titanium dioxide having a ramsdellite structure may be used. The ramsdellite titanium dioxide can be obtained by carrying out lithium elimination treatment on ramsdellite $Li_{0.5}TiO_2$ using chemical oxidation. Only one kind of the above described titanium dioxides may be used, and two or more kinds of the above described titanium dioxides may be used in combination.

Examples of the black pigment include carbon black, perylene black, titanium black, cyanine black, aniline black, and a mixed-color organic pigment which is pseudo blackened by mixing two or more kinds of pigments. One or more kinds of such compounds may be used as the black pigment. Among these compounds, carbon black, perylene black, and titanium black are preferred since they make it possible to form the black solder resist layer having the high concealing property.

In addition, since the mass ratio of the (C1) component to the (C2) component is within a range of 2:1 to 1:10 and the solder resist composition contains the phosphorescent fluorescent dye, the solder resist layer can be thoroughly cured from the surface to the deep part even if the solder resist composition contains the white pigment or the black pigment.

[Other Components]

The solder resist composition may contain a thermosetting component. The thermosetting component can provide the solder resist composition with thermosettability.

The thermosetting component preferably contains a compound having a cyclic ether skeleton. The compound having a cyclic ether skeleton especially preferably contains an epoxy compound.

The epoxy compound preferably has at least two epoxy groups per molecule. The epoxy compound may be a hardly soluble epoxy compound and may be a generic soluble epoxy compound. Kinds of the epoxy compound is not particularly limited, but the epoxy compound especially preferably contains one or more kinds of compounds selected from a group consisting of phenol novolak epoxy resin (for example, EPICLON N-775 manufactured by DIC Corporation), cresol novolak epoxy resin (for example, EPICLON N-695 manufactured by DIC Corporation), bisphenol A epoxy resin (for example, jER1001 manufactured by Mitsubishi Chemical Corporation), bisphenol A-novolak epoxy resin (for example, EPICLON N-865 manufactured by DIC Corporation), bisphenol F epoxy resin (for example, jER4004P manufactured by Mitsubishi Chemical Corporation), bisphenol S epoxy resin (for example, EPICLON EXA-1514 manufactured by DIC Corporation), bisphenol AD epoxy resin, biphenyl epoxy resin (for example, YX4000 manufactured by Mitsubishi Chemical Corporation), biphenyl novolak epoxy resin (for example, NC-3000 manufactured by Nippon Kayaku Co., Ltd.), hydrogenated bisphenol A epoxy resin (for example, ST-4000D manufactured by Nippon Steel & Sumikin Chemical Co., Ltd.), naphthalene epoxy resin (for example, EPICLON HP-4032, EPICLON HP-4700, EPICLON HP-4770 manufactured by DIC Corporation), hydroquinone epoxy resin (for example, YDC-1312 manufactured by Nippon Steel & Sumikin Chemical Co., Ltd.), tertiary butylcatechol epoxy resin (for example, EPICLON HP-820 manufactured by DIC Corporation), dicyclopentadiene epoxy resin (for example, EPICLON HP-7200 manufactured by DIC Corporation), adamantane epoxy resin (for example, ADAMANTATE X-E-201 manufactured by Idemitsu Kosan Co., Ltd.), biphenylether epoxy resin (for example, YSLV-80DE manufactured by Nippon Steel & Sumikin Chemical Co., Ltd.), special two-functional epoxy resin (for example, YL7175-500 and YL7175-1000 manufactured by Mitsubishi Chemical Corporation; EPICLON TSR-960, EPICLON TER-601, EPICLON TSR-250-80BX, EPICLON 1650-75MPX, EPICLON EXA-4850, EPICLON EXA-4816, EPICLON EXA-4822, and EPICLON EXA-9726 manufactured by DIC Corporation; YSLV-120TE manufactured by Nippon Steel & Sumikin Chemical Co., Ltd.), and bisphenol epoxy resin excluding the above.

It is also preferably that the epoxy compound contains triglycidyl isocyanurate. The triglycidyl isocyanurate is especially preferably in a form of β isomers, in which three epoxy groups are located on the same side with respect to a flat s-triazine ring, or in a mixture of β isomers and α isomers, in which one epoxy group is located on the different side from other two epoxy groups with respect to a flat s-triazine ring.

The epoxy compound also preferably contains phosphorus-containing epoxy resin. In this case, the flame retardancy of the cured product of the solder resist composition is improved. Examples of the phosphorus-containing epoxy resin may include phosphoric acid-modified bisphenol F epoxy resin (for example, EPICLON EXA-9726 and EPI- CLON EXA-9710 manufactured by DIC Corporation) and Epotobto FX-305 manufactured by Nippon Steel & Sumikin Chemical Co., Ltd.

The solder resist composition may contain an organic solvent. The organic solvent is used to liquefy the solder resist composition or form varnish with the solder resist composition, and to adjust viscosity, applicability, and film-formability.

The organic solvent may contain one or more kinds of compounds selected from a group consisting of: for example, straight, branched, secondary, or poly alcohols such as ethanol, propyl alcohol, isopropyl alcohol, hexanol, and ethylene glycol; ketones such as methyl ethyl ketone and cyclohexanone; aromatic hydrocarbons such as toluene and xylene; petroleum aromatic mixed solvents such as Swazol series (manufactured by Maruzen Petrochemical Co., Ltd.) and Solvesso series (manufactured by Exxon Mobil Chemical Corporation); cellosolves such as cellosolve and butyl cellosolve; carbitols such as carbitol and butyl carbitol; propylene glycol alkyl ethers such as propylene glycol methyl ether; polypropylene glycol alkyl ethers such as dipropylene glycol methyl ether, acetic acid esters such as ethyl acetate, butyl acetate, cellosolve acetate, and carbitol acetate; and dialkyl glycol ethers.

An amount of the organic solvent in the solder resist composition is preferably adjusted so that the organic solvent volatilizes quickly when a coating film formed with the solder resist composition is dried, i.e. the organic solvent does not remain in the dry coating film. Especially, the amount of the organic solvent is preferably within a range of 0 to 99.5 weight % and further preferably within a range of 15 to 80 weight %, with respect to the total content of the solder resist composition. Note that, since an appropriate amount of the organic solvent depends on a coating method, the amount is preferably adjusted appropriately depending on the coating method.

Without departing from the scope of the present invention, the solder resist composition may contain components other than the above described components.

For example, the solder resist composition may contain one or more kinds of resin selected from a group consisting of: blocked isocyanates of tolylene diisocyanate, morpholine diisocyanate, isophorone diisocyanate, and hexamethylene diisocyanate which are blocked with caprolactam, oxime, maleic acid ester, and the like; amino resin such as melamine resin, n-butylated melamine resin, isobutylated melamine resin, butylated urea resin, butylated melamine-urea co-condensed resin, and benzoguanamine-based co-condensed resin; various thermosetting resin other than the above; ultraviolet rays-curing epoxy (meth)acrylate; resin obtained by adding (meth)acrylic acid to epoxy resin such as bisphenol A epoxy resin, phenol novolak epoxy resin, cresol novolak epoxy resin, and alicyclic epoxy resin; and polymeric compounds such as diallyl phthalate resin, phenoxy resin, urethane resin, and fluorine resin.

In a case where the solder resist composition contains the epoxy compound, the solder resist composition may further contain a curing agent to cure the epoxy compound. The curing agent may contain one or more kinds of compounds selected from a group consisting of: for example, imidazole derivatives such as imidazole, 2-methylimidazole, 2-ethylimidazole, 2-ethyl-4-methylimidazole, 2-phenylimidazole, 4-phenylimidazole, I-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid hydrazide and sebacic acid hydrazide; phosphorus compounds such as triphenylphosphine; acid anhydrides; phenols; mercaptans; Lewis acid amine complexes; and onium salts. Examples of commercial products of the above compounds may include: 2MZ-A, 2MZ-OK, 2PHZ, 2P4BHZ, and 2P4MHZ manufacture by Shikoku Chemicals Corporation (product names for commercial products of imidazole compounds); U-CAT3503N and U-CAT3502T manufactured by San-Apro Ltd. (product names for commercial products of blocked isocyanates of dimethylamine); and DBU, DBN, U-CATSA 102, and U-CAT5002 manufactured by San-Apro Ltd. (bicyclic amidine compounds and salts thereof).

The solder resist composition may contain an adhesiveness-imparting agent. Examples of the adhesiveness-imparting agent may include: guanamine; acetoguanamine; benzoguanamine; melamine; and S-triazine derivatives such as 2,4-diamino-6-methacryloyloxyethyl-S-triazine, 2-vinyl-4,6-diamino-S-triazine, 2-vinyl-4,6-diamino-S-triazine-isocyanuric acid adduct, and 2,4-diamino-6-methacryloyloxyethyl-S-triazine-isocyanuric acid adduct.

The solder resist composition may contain one or more kinds of compounds selected from a group consisting of: a curing promoter; a coloring agent other than white; a copolymer such as silicones and acrylates; a leveling agent; an adhesiveness-imparting agent such as silane coupling agents; a thixotropy agent; a polymerization inhibitor; a halation preventer; a flame retardant; a defoamer; a surfactant; a polymer dispersant; and an inorganic filler such as barium sulfate, crystalline silica, nano silica, carbon nanotube, talc, bentonite, aluminum hydroxide, magnesium hydroxide, magnesium oxide, and calcium carbonate.

The solder resist composition may further contain a known photopolymerization promoter and a known sensitizer. The solder resist composition may contain, for example, p-dimethylbenzoic acid ethylester, p-dimethylaminobenzoic acid isoamyl ester, and 2-dimethylaminoethyl benzoate.

[Amount of Each Component and Preparation Method]

An amount of each component in the solder resist composition is appropriately adjusted so that the solder resist composition has photocurability and is developable with an alkaline solution.

An amount of (A) the carboxyl group-containing resin is preferably within a range of 5 to 85 weight % a, more preferably within a range of 10 to 80 weight %, and further preferably within a range of 15 to 50 weight %, with respect to solid content of the solder resist composition.

An amount of (B) the photopolymerizable compound is preferably within a range of 1 to 45 weight %, more preferably within a range of 2 to 40 weight %, and further preferably within a range of 10 to 30 weight %, with respect to the solid content of the solder resist composition.

In a case where the solder resist composition contains the thermosetting component, an amount of the thermosetting component is preferably within a range of 1.5 to 65 weight %, more preferably within a range of 2.0 to 60 weight %, and further preferably within a range of 3.0 to 35 weight %, with respect to the solid content of the solder resist composition.

An amount of (C) the photopolymerization initiator is preferably within a range of 0.1 to 30 weight % and further preferably within a range of 4 to 20 weight %, with respect to the solid content of the solder resist composition.

An amount of (D) the fluorescent dye is preferably within a range of 0.0001 to 80 weight %, with respect to the amount of the photopolymerization initiator in the solder resist composition. The amount of the fluorescent dye is especially preferably within a range of 1 to 30 weight % with respect to the amount of the photopolymerization initiator, and also preferably within a range of 0.04 to 2 weight % with respect to the total content of the solder resist composition.

An amount of (E) the antioxidant is preferably within a range of 0.1 to 20 weight % and further preferably within a range of 0.3 to 10 weight %, with respect to the amount of the carboxyl group-containing resin.

An amount of (F) the coloring pigment is preferably within a range of 0.05 to 80 weight %/o and further preferably within a range of 0.2 to 60 weight %, with respect to the solid content of the solder resist composition. An amount of titanium dioxide is preferably within a range of 3 to 80 weight % and further preferably within a range of 25 to 60 weight %, with respect to the solid content of the solder resist composition. In these ranges, the solder resist layer can exhibit the high concealing property and the high light reflectivity, and properties required as a resist such as heat resistance and pencil hardness are also ensured high.

Note that the solid content of the solder resist composition is defined as a total amount of all components included in the solder resist composition except for components such as solvents which volatilize in formation of the solder resist layer from the solder resist composition. In addition, the resin content of the solder resist composition is defined as a total amount of the carboxyl group-containing resin, the photopolymerizable compound, and the thermosetting component included in the solder resist composition.

Ingredients as described above for the solder resist composition are combined and kneaded by a known kneading method using, for example, a three-roll, a ball mill, or a sand mill to obtain the solder resist composition.

Considering the storage stability of the solder resist composition, some of the ingredients of the solder resist composition may be mixed to obtain a first mixture, and the rest of the ingredients may be mixed to obtain a second mixture. That is, the solder resist composition may include the first mixture and the second mixture. For example, the photopolymerizable compound, some of the organic solvents, and the thermosetting component out of all the ingredients may be mixed and dispersed in advance to obtain the first mixture, and the rest of the ingredients may be mixed and dispersed to obtain the second mixture. In this case, appropriate amounts of the first mixture and the second mixture may be mixed to obtain a mixture which is used to form the solder resist layer.

[Covered Printed Wiring Board]

The solder resist composition according to the present embodiment is used, for example, to form a solder resist layer on a printed wiring board. Accordingly, a covered printed wiring board is manufactured.

Described below is an example of a method to form the solder resist layer on the printed wiring board using the solder resist composition according to the present embodiment. In this example, a solder resist layer is formed with a solder resist composition which has the photocurability and the thermosettability.

First, a printed wiring board is prepared, and a coating film of the solder resist composition is formed on the printed wiring board. For example, a surface of the printed wiring board is coated with the solder resist composition to form the coating film in a wet state (wet coating film). A coating method to coat the printed wiring board with the solder resist composition is selected from a group consisting of known methods such as, for example, a dipping method, a spray method, a spin coating method, a roll coating method, a curtain coating method, and a screen printing method. Subsequently, if necessary, in order for the organic solvent in the solder resist composition to volatilize, the wet coating film is dried at a temperature, for example, within a range of 60 to 120° C. to obtain the coating film after drying (dry coating film).

Note that, in formation of the coating film on the printed wiring board, the solder resist composition may be applied to an appropriate supporting body and dried to form the dry coating film in advance. The dry coating film may be then stacked on the printed wiring board, and pressure is applied to the dry coating film and the printed wiring board to form the dry coating film on the printed wiring board (a dry film method).

Subsequently, a negative mask is placed either directly or indirectly on the dry coating film on the printed wiring board and then the active energy rays are irradiated to the negative mask so that the coating film is exposed to light through the negative mask. The negative mask includes an exposed part, which transmits the active energy rays, and an unexposed part, which does not transmit the active energy rays. The exposed part of the negative mask has a shape corresponding to a pattern shape of the solder resist layer. For example, photo tools such as a mask film and a dry plate are used as the negative mask. A kind of active energy rays is selected depending on composition of the solder resist composition, and ultraviolet rays are used in the present embodiment. A light source for ultraviolet rays is selected from a group consisting of, for example, a chemical lamp, a low pressure mercury lamp, a medium pressure mercury lamp, a high pressure mercury lamp, an ultra-high pressure mercury lamp, a xenon lamp, and a metal halide lamp.

Note that a method which does not use a negative mask may be employed as an exposure method. For example, a direct drawing method such as laser exposure may be employed.

In the present embodiment, when the dry coating film is exposed to ultraviolet rays, the photocuring reaction proceeds efficiently in the dry coating film from its surface part to its deep part, as described above.

After the dry coating film is exposed to light, the negative mask is removed from the printed wiring board and then the dry coating film undergoes a development process to remove the unexposed part of the dry coating film. Accordingly, the exposed part of the dry coating film remains as the solder resist layer on a first surface and a second surface of the printed wiring board.

In the development process, an appropriate developer depending on the composition of the solder resist composition may be used. Examples of the developer may include alkaline solutions such as aqueous solutions of sodium carbonate, potassium carbonate, ammonium carbonate, sodium hydrogen carbonate, potassium hydrogen carbonate, ammonium hydrogen carbonate, sodium hydroxide, potassium hydroxide, ammonium hydroxide, tetramethylammonium hydroxide, and lithium hydroxide. Organic amines such as monoethanol amine, diethanol amine, triethanol amine, monoisopropanol amine, diisopropanol amine, and triisopropanol amine may be used as the developer. Above described developers may be used alone or in combination. When the developer is the alkaline solution, a solvent of the alkaline solution may be water alone or may be a mixture of water and a hydrophilic organic solvent such as lower alcohols.

When the solder resist composition contains the thermosetting component, the solder resist layer may be thermosetted by heat treatment, if necessary. As for conditions of the heat treatment, for example, a heating temperature is within a range of 120 to 180° C. and a heating period is within a range of 30 to 90 minutes. Accordingly, properties of the solder resist layer, such as strength, hardness, and chemical resistance, are improved.

Furthermore, after the solder resist layer undergoes the heat treatment, the solder resist layer may be irradiated with ultraviolet rays again if necessary. In this case, the photo-curing reaction further proceeds in the solder resist layer. Accordingly, migration resistance of the solder resist layer is further improved.

As a result, the covered printed wiring board which includes the printed wiring board and the solder resist layer covering the printed wiring board is obtained. In the present embodiment, the solder resist layer is cured thoroughly from its surface to its deep part.

The present embodiment explained above has the following characteristics.

The solder resist composition according to the present embodiment contains: (A) the carboxyl group-containing resin; (B) the photopolymerizable compound selected from a group consisting of a photopolymerizable monomer and a photopolymerizable prepolymer; (C) the photopolymerization initiator containing the bisacylphosphine oxide-based photopolymerization initiator and the α-hydroxy alkylphenone-based photopolymerization initiator; and (D) the fluorescent dye. The bisacylphosphine oxide-based photopolymerization initiator is bis-(2,4,6-trimethylbenzoyl)-phenylphosphine oxide. The α-hydroxy alkylphenone-based photopolymerization initiator is 2-hydroxy-2-methyl-1-phenyl-propane-1-one. The mass ratio of the bis-(2,4,6-trimethylbenzoyl)-phenylphosphine oxide to the 2-hydroxy-2-methyl-1-phenyl-propane-1-one is 2:1 to 1:10.

Accordingly, the crystals of the bisacylphosphine oxide-based photopolymerization initiator are less likely to be precipitated in the solder resist composition according to the present embodiment. Due to this, the solder resist composition has the good storage stability. Also, the photo-curing reaction proceeds efficiently from the surface to the deep part of the coating film formed with the solder resist composition under exposure to ultraviolet rays.

In addition to the above characteristics, it is preferable that the solder resist composition of the present embodiment further contains (E) the antioxidant.

Accordingly, generation of oxygen radicals which may inhibit UV curing is prevented under exposure to light, making it possible to increase the resolution of the solder resist composition according to the present embodiment. In addition, the antioxidant can remove oxygen which may promote coloring of the solder resist layer during heat treatment of the printed wiring board (the covered printed wiring board below) including the solder resist layer, leading to less yellowing of the solder resist layer due to heat.

In addition to the above characteristics, it is preferable that (A) the carboxyl group-containing resin is (A2) the carboxyl group-containing resin which contains a photopolymerizable functional group, in the present embodiment.

Accordingly, (A) the carboxyl group-containing resin can be polymerized by both of photopolymerization and thermal polymerization, leading to the high sensitivity.

In addition to the above characteristics, it is preferable that the solder resist composition of the present embodiment further contains (F) the coloring pigment.

Accordingly, the light reflectivity and the concealing property of the solder resist layer can be improved.

In addition to the above characteristics, it is preferable that (F) the coloring pigment is the white pigment or the black pigment, in the present embodiment.

Accordingly, the light reflectivity and the concealing property of the solder resist layer can be further improved.

The covered printed wiring board according to the present embodiment includes: the printed wiring board; and the solder resist layer covering the printed wiring board. The solder resist layer is formed with the solder resist composition according to any one of the above described solder resist compositions.

Accordingly, the solder resist layer is thoroughly cured from the surface to the deep part in the covered printed wiring board according to the present embodiment.

EXAMPLES

Hereinafter, examples of the present invention are described. Note that the present invention is not limited to following examples.

Preparations of Carboxyl Group-Containing Resin Solutions

Synthesis Example 1

48 parts by mass of methacrylic acid, 50 parts by mass of ω-carboxyl-polycaprolactone (n≈2) monoacrylate (ARONIX M-5300 manufactured by TOAGOSEI CO., LTD.), 92 parts by mass of methyl methacrylate, 10 parts by mass of styrene, 430 parts by mass of dipropylene glycol monomethyl ether, and 3.5 parts by mass of azobisisobutyronitrile were added to a four-neck flask equipped with a reflux condenser, a thermometer, a glass tube for nitrogen-substitution, and a stirrer. A mixture in the four-neck flask was heated at 75° C. for 5 hours under a nitrogen gas stream for a polymerization reaction to proceed, resulting in a 32% copolymer solution.

0.1 parts by mass of hydroquinone, 64 parts by mass of glycidyl methacrylate, and 0.8 parts by mass of dimethylbenzylamine were added to the copolymer solution and then the mixture was heated at 80° C. for 24 hours for an addition reaction to proceed. As a result, a 38% solution (carboxyl group-containing resin solution A) of a compound which contains a carboxyl group and an ethylene-based unsaturated group was obtained.

Synthesis Example 2

60 parts by mass of methacrylic acid, 20 parts by mass of N-phenylmaleimide, 80 parts by mass of methyl methacrylate, 20 parts by mass of t-butyl methacrylate, 20 parts by mass of styrene, 300 parts by mass of dipropylene glycol monomethyl ether, and 3.5 parts by mass of azobisisobutyronitrile were added to a four-neck flask equipped with a reflux condenser, a thermometer, a glass tube for nitrogen-substitution, and a stirrer. A mixture in the four-neck flask was heated at 75° C. for 5 hours under a nitrogen gas stream for a polymerization reaction to proceed. As a result, a 40% solution (carboxyl group-containing resin solution B) of a compound which contains a carboxyl group was obtained.

[Preparations of Solder Resist Compositions]

A mixture obtained by mixing components listed in the tables below was kneaded using three-roll to obtain a solder resist composition. Note that details of the components listed in the tables are as following.

*Epoxy compound: isocyanuric acid triglycidyl manufactured NISSAN CHEMICAL INDUSTRIES, Ltd., item No. TEPIC-HP).

*Photopolymerizable compound: dipentaerythritol hexaacrylate (manufactured by Nippon. Kayaku Co., Ltd., item No. KAYARAD DPHA).

*Titanium dioxide A: ruffle titanium dioxide manufactured by a sulfuric acid method, manufactured by SAKAI CHEMICAL INDUSTRY CO., LTD., item No. R-79.

*Titanium dioxide B: ruffle titanium dioxide manufactured by a chlorine method, manufactured by ISHIHARA SANGYO KAISHA, LTD., item No. CR-90

*Carbon black: manufactured by Mitsubishi Chemical Corporation, item No. MA-7.

*Barium sulfate: manufactured by SAKAI CHEMICAL INDUSTRY CO., LTD., item No. BARIACE B30,

*Photopolymerization initiator A: bis-(2,4,6-trimethyl-benzoyl)-phenylphosphine oxide, manufactured by BASF, item No. Irgacure 819.

*Photopolymerization initiator B: 2,4,6-trimethylol-diphenyl-phosphine oxide, manufactured by BASF, item No. Irgacure TPO.

*Photopolymerization initiator C: 2-hydroxy-2-methyl-1-phenyl-propane-1-one, manufactured by BASF, item No. Irgacure 1173.

*Photopolymerization initiator D: 1-hydroxy-cyclohexyl-phenyl-ketone, manufactured by BASE, item No. Irgacure 184.

*Antioxidant: 2,4,6-tris(3',5'-di-tert-butyl-4'-hydroxybenzyl)mesitylene, manufactured by BASF, item No. IRGANOX 1330.

*Melamine: manufactured by NISSAN CHEMICAL. INDUSTRIES, Ltd., fine-particulate melamine.

*Defoamer: manufactured by Shin-Etsu Chemical. Co., Ltd., item No. KS-66.

Fluorescent dye A: a naphthalene benzoxazole derivative, manufactured by Clariant Japan K.K., item No. Hostalux KCB.

*Phosphorescent Fluorescent dye B: 2,5-thiophenediylbis (5-tert-butyl-1,3-benzoxazole), manufactured by BASF, item No, TINOPAL OB.

[Evaluation Tests]

(1) Preparation of Test Pieces

A glass epoxy copper-clad laminated plate including a copper foil with thickness of 35 μm was prepared. A conductor wiring was formed by etching on the glass epoxy copper-clad laminated plate to obtain a printed wiring board. A surface of the obtained printed wiring board was entirely coated with the solder resist composition by a screen printing method and thereby a coating film was formed. The coating film was dried by heating at 80° C. for 20 minutes. Thickness of the coating film after drying (dry coating film) was 20 μm. With a negative mask placed directly on the dry coating film, the negative mask was irradiated with ultraviolet rays, and accordingly the dry coating film was selectively exposed to light with 400 mJ/cm² of exposure. Then, the negative mask was removed from the dry coating film, and the dry coating film was developed with a 1% carbonate aqueous solution for 60 seconds so that a part of the dry coating film, which was cured due to exposure to light, remained as a solder resist layer on the printed wiring board. The solder resist layer was further heated at 150° C. for 60 minutes and thermosetted. As a result, a test piece including the solder resist layer was obtained.

Following evaluation tests were carried out for each test piece.

(2) Evaluation of Photosensitivity (Remained Steps)

A test mask for exposure to light (Step Tablet PHOTEC 21-steps manufactured by Hitachi Chemical Co., Ltd.) was directly placed and attached by low pressure adhesion on the dry coating film formed with the solder resist composition of each example and comparative example. Then, the dry coating film was irradiated with ultraviolet rays with irradiation energy density of 400 mJ/cm² through the test mask, using a both-side exposing device of low pressure adhesion type manufactured by ORC Manufacturing Co., Ltd. (model No. ORC HMW680GW). The dry coating film was then developed with a developer (a sodium carbonate aqueous solution with concentration of 1 weight %). Photosensitivity of the dry coating film was evaluated in terms of the number of remained steps.

(3) Evaluation of Curability in the Deep Part (Evaluation of Remained Solder Dam)

A printed wiring board including a copper conductor wiring with line width of 0.2 mm, line interval of 0.3 mm, and thickness of 40 μm was prepared. A negative mask, which has a mask pattern to form solder dams with four different widths of 50 μm, 75 μm, 90 μm, and 100 μm was used. Under the same conditions as the preparation of the test pieces other than using the above printed wiring board and the above negative mask, solder dams with thickness of 60 μm were formed on the printed wiring board.

Peeling test was carried out on the solder dams using a cellophane adhesion tape, and a minimum width of the remained solder dams, which was not peeled off, on the printed wiring board was measured. It is evaluated that the smaller the minimum width is, the higher curing degree is in the deep part of the solder dams.

(4) Evaluation of Heat Yellowing Resistance

A b* value in L*a*b* color system was measured for the solder resist layer of each test piece right after preparation, using a spectral colorimeter manufactured by KONICA MINOLTA SENSING, INC. (model No. CM-600d). Succeedingly, each test piece was heated at 250° C. for 5 minutes and then the b* value of the solder resist layer was measured again. A value (Δb*) was calculated by subtracting the b* value of the solder resist layer before heating from the b* value of the solder resist layer after heating. The results were evaluated as follows.

A: The Δb* value was less than or equal to 1.4.
B: The Δb* value was 1.5 to 1.9.
C: The Δb* value was 2.0 to 2.4.
D: The Δb* value was larger than or equal to 2.5.

(5) Evaluation of Storage Stability

The solder resist composition was stored in a refrigerator at 4° C. for a week. After that, the solder resist composition was applied on a glass plate at a thickness of 20 μm, and the applied coating film was observed visually. The results were evaluated as follows.

A: No particles (microparticles) are observed in the coating film.
B: Particles (microparticles) are observed in the coating film.

TABLE 1

|  |  | Examples | | | | | | | | | |
| --- | --- | --- | --- | --- | --- | --- | --- | --- | --- | --- | --- |
|  |  | 1 | 2 | 3 | 4 | 5 | 6 | 7 | 8 | 9 | 10 |
| Composition (parts by mass) | Carboxyl group-containing resin solution A | 80 | 80 | 80 | 80 | 80 | 80 | 80 | — | 80 | 80 |
|  | Carboxyl group-containing resin solution B | — | — | — | — | — | — | — | 80 | — | — |
|  | Epoxy compound | 7 | 7 | 7 | 7 | 7 | 7 | 7 | 7 | 7 | 7 |
|  | Photopolymerizable compound | 25 | 25 | 25 | 25 | 25 | 25 | 25 | 30 | 25 | 25 |
|  | Titanium dioxide A | 80 | — | 80 | 80 | 80 | 80 | 80 | 80 | — | 80 |
|  | Titanium dioxide B | — | 80 | — | — | — | — | — | — | — | — |
|  | Carbon black | — | — | — | — | — | — | — | — | 1.5 | — |
|  | Barium sulfate | — | — | — | — | — | — | — | — | 70 | — |
|  | Photopolymerizable initiator A | 3 | 3 | 2 | 4 | 4 | 4 | 5 | 5 | 5 | 3 |
|  | Photopolymerizable initiator B | — | — | 5 | — | — | — | — | — | — | 3 |
|  | Photopolymerizable initiator C | 6 | 3 | 20 | 10 | 10 | 10 | 12 | 12 | 12 | 1.5 |
|  | Photopolymerizable initiator D | — | 3 | — | — | — | — | — | — | — | — |
|  | Antioxidant | 1 | 1 | 1 | 1 | 1 | 1 | 1 | 1 | 1 | 1 |
|  | Melamine | 2 | 2 | 2 | 2 | 2 | 2 | 2 | 2 | 2 | 2 |
|  | Defoamer | 2 | 2 | 2 | 2 | 2 | 2 | 2 | 2 | 2 | 2 |
|  | Fluorescent dye A | 0.3 | 0.3 | 0.3 | 0.2 | 2 | 0.15 | — | 0.5 | — | 0.3 |
|  | Fluorescent dye B | — | — | — | — | — | — | 0.3 | — | 0.5 | — |
| Evaluation | Photosensitivity | 10 | 10 | 12 | 11 | 11 | 11 | 12 | 9 | 12 | 10 |
|  | Curability in the deep part (μm) | 50 | 50 | 75 | 50 | 50 | 50 | 50 | 75 | 50 | 50 |
|  | Heat yellowing resistance | A | A | A | A | A | A | A | A | — | A |
|  | Storage stability | A | A | A | A | A | A | A | A | A | A |

|  |  | Comparative examples | | | | | |
| --- | --- | --- | --- | --- | --- | --- | --- |
|  |  | 1 | 2 | 3 | 4 | 5 | 6 |
| Composition (parts by mass) | Carboxyl group-containing resin solution A | 80 | 80 | 80 | 80 | 80 | 80 |
|  | Carboxyl group-containing resin solution B | — | — | — | — | — | — |
|  | Epoxy compound | 7 | 7 | 7 | 7 | 7 | 7 |
|  | Photopolymerizable compound | 25 | 25 | 25 | 25 | 25 | 25 |
|  | Titanium dioxide A | 80 | 80 | 80 | 80 | 80 | 80 |
|  | Titanium dioxide B | — | — | — | — | — | — |
|  | Carbon black | — | — | — | — | — | 1.5 |
|  | Barium sulfate | — | — | — | — | — | 70 |
|  | Photopolymerizable initiator A | 4 | 2 | 5 | — | — | 5 |
|  | Photopolymerizable initiator B | — | 5 | — | 5 | 5 | — |
|  | Photopolymerizable initiator C | 10 | 30 | 2 | — | — | — |
|  | Photopolymerizable initiator D | — | — | — | 10 | 10 | — |
|  | Antioxidant | 1 | 1 | 1 | 1 | — | — |
|  | Melamine | 2 | 2 | 2 | 2 | 2 | 2 |
|  | Defoamer | 2 | 2 | 2 | 2 | 2 | 2 |
|  | Fluorescent dye A | — | 0.3 | 0.2 | 0.2 | 0.2 | — |
|  | Fluorescent dye B | — | — | — | — | — | — |
| Evaluation | Photosensitivity | 8 | 12 | 11 | 6 | 6 | 9 |
|  | Curability in the deep part (μm) | 75 | 90 | 50 | 90 | 100 | 75 |
|  | Heat yellowing resistance | A | B | A | A | D | — |
|  | Storage stability | A | A | B | A | A | B |

The invention claimed is:

1. A solder resist composition comprising:
(A) a carboxyl group-containing resin;
(B) a photopolymerizable compound selected from a group consisting of a photopolymerizable monomer and a photopolymerizable prepolymer;
(C) a photopolymerization initiator containing a bisacylphosphine oxide-based photopolymerization initiator and an α-hydroxy alkylphenone-based photopolymerization initiator;
(D) a fluorescent dye;
(E) an antioxidant containing a phenol antioxidant; and
(F) a coloring pigment,
the bisacylphosphine oxide-based photopolymerization initiator being bis-(2,4,6-trimethylbenzoyl)-phenyl-phosphine oxide,
the α-hydroxy alkylphenone-based photopolymerization initiator being 2-hydroxy-2-methyl-1-phenyl-propane-1-one,
a mass ratio of the bis-(2,4,6-trimethylbenzoyl)-phenyl-phosphine oxide to the 2-hydroxy-2-methyl-1-phenyl-propane-1-one being 2:1 to 1:10,
an amount of (E) the antioxidant being within a range of 0.1 to 20 weight % with respect to an amount of (A) the carboxyl group-containing resin,
(F) the coloring pigment containing a black pigment, and an amount of the black pigment being within a range of 0.2 to 80 weight % with respect to a solid content of the solder resist composition.

2. The solder resist composition according to claim 1, wherein
(A) the carboxyl group-containing resin is (A2) a carboxyl group-containing resin which contains a photopolymerizable functional group.

3. The solder resist composition according to claim 1, wherein the black pigment is selected from the group consisting of carbon black, perylene black, titanium black, cyanine black, aniline black, and a mixed-color organic pigment which is pseudo blackened by mixing two or more kinds of pigments.

4. The solder resist composition according to claim 1, further comprising an adhesiveness-imparting agent selected from the group consisting of guanamine, acetoguanamine, benzoguanamine, melamine, and S-triazine derivatives.

5. The solder resist composition according to claim 1, further comprising an inorganic filler selected from the group consisting of barium sulfate, crystalline silica, nano silica, carbon nanotube, talc, bentonite, aluminum hydroxide, magnesium hydroxide, magnesium oxide, and calcium carbonate.

6. A covered printed wiring board, comprising:
   a printed wiring board; and
   a solder resist layer covering the printed wiring board, the solder resist layer being formed with the solder resist composition according to claim 1.

\* \* \* \* \*